(12) United States Patent
Zanma et al.

(10) Patent No.: US 9,220,168 B2
(45) Date of Patent: Dec. 22, 2015

(54) WIRING BOARD WITH BUILT-IN ELECTRONIC COMPONENT

(71) Applicant: IBIDEN CO., LTD., Ogaki-shi (JP)

(72) Inventors: Masahiro Zanma, Ogaki (JP); Masafumi Niwa, Ogaki (JP); Toshiki Furutani, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/168,414

(22) Filed: Jan. 30, 2014

(65) Prior Publication Data
US 2014/0216800 A1  Aug. 7, 2014

(30) Foreign Application Priority Data

Feb. 5, 2013  (JP) ................. 2013-020710

(51) Int. Cl.
| | |
|---|---|
| *H05K 1/11* | (2006.01) |
| *H05K 1/18* | (2006.01) |
| *H05K 3/00* | (2006.01) |
| *H05K 3/46* | (2006.01) |

(52) U.S. Cl.
CPC ............... *H05K 1/185* (2013.01); *H05K 3/007* (2013.01); *H05K 3/4602* (2013.01); *H05K 3/4644* (2013.01)

(58) Field of Classification Search
CPC ....... H05K 1/186; H05K 1/185; H05K 1/182; H05K 1/183
See application file for complete search history.

(56) References Cited

U.S. PATENT DOCUMENTS

| | | | |
|---|---|---|---|
| 2005/0001331 A1* | 1/2005 | Kojima et al. | 257/778 |
| 2007/0030628 A1* | 2/2007 | Yamamoto et al. | 361/311 |
| 2007/0120249 A1* | 5/2007 | Kawamoto | 257/702 |
| 2009/0244865 A1* | 10/2009 | Tanaka | 361/764 |
| 2010/0224397 A1* | 9/2010 | Shimizu et al. | 174/260 |
| 2010/0300737 A1* | 12/2010 | Sato et al. | 174/260 |
| 2013/0284506 A1 | 10/2013 | Zanma et al. | |

FOREIGN PATENT DOCUMENTS

JP    2001-284824 A    10/2001

OTHER PUBLICATIONS

U.S. Appl. No. 14/063,052, filed Oct. 25, 2013, Sato, et al.

\* cited by examiner

*Primary Examiner* — Steven T Sawyer
(74) *Attorney, Agent, or Firm* — Oblon, McClelland, Maier & Neustadt, L.L.P.

(57) ABSTRACT

A wiring board with a built-in electronic component includes a core substrate having the thickness not exceeding 300 μm and having a cavity having an opening on a surface of the core substrate, an electronic component having the thickness not exceeding 300 μm and accommodated in the cavity of the core substrate, and a laminated structure formed on the surface of the core substrate and including an insulation resin layer and a wiring layer such that the laminated structure is covering the opening of the cavity of the core substrate and the electronic component accommodated in the cavity of the core substrate. The electronic component has an insulation material body and an electrode formed on a surface of the insulation material body, and the wiring layer of the laminated structure is formed such that the thickness of the wiring layer is set smaller than the thickness of the electrode.

20 Claims, 6 Drawing Sheets

WIRING BOARD WITH BUILT-IN ELECTRONIC COMPONENT

CROSS-REFERENCE TO RELATED APPLICATIONS

The present application is based upon and claims the benefit of priority to Japanese Patent Application No. 2013-020710, filed Feb. 5, 2013, the entire contents of which are incorporated herein by reference.

BACKGROUND OF THE INVENTION

1. Field of the Invention

The present invention relates to a wiring board with a built-in electronic component having an electronic component accommodated in a cavity of a core substrate and having an upper layer laminated thereon. More specifically, the invention relates to a wiring board with a built-in electronic having a thin structure.

2. Description of Background Art

JP 2001-284824 A describes a wiring board with a built-in electronic component. The wiring board with a built-in electronic component illustrated in JP 2001-284824 A has a chip capacitor accommodated in a concavity of a substrate. The entire contents of this publication are incorporated herein by reference.

SUMMARY OF THE INVENTION

According to one aspect of the present invention, a wiring board with a built-in electronic component includes a core substrate having the thickness not exceeding 300 μm and having a cavity having an opening on a surface of the core substrate, an electronic component having the thickness not exceeding 300 μm and accommodated in the cavity of the core substrate, and a laminated structure formed on the surface of the core substrate and including an insulation resin layer and a wiring layer such that the laminated structure is covering the opening of the cavity of the core substrate and the electronic component accommodated in the cavity of the core substrate. The electronic component has an insulation material body and an electrode formed on a surface of the insulation material body, and the wiring layer of the laminated structure is formed such that the thickness of the wiring layer is set smaller than the thickness of the electrode.

According to another aspect of the present invention, a wiring board with a built-in electronic component includes a core substrate having the thickness not exceeding 300 μm and having a cavity having an opening on a surface of the core substrate, an electronic component having the thickness not exceeding 300 μm and accommodated in the cavity of the core substrate, and a laminated structure formed on the surface of the core substrate and including an insulation resin layer and a wiring layer such that the laminated structure is covering the opening of the cavity of the core substrate and the electronic component accommodated in the cavity of the core substrate. The laminated structure is formed such that the thickness of the laminated structure is set smaller than the thickness of the core substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
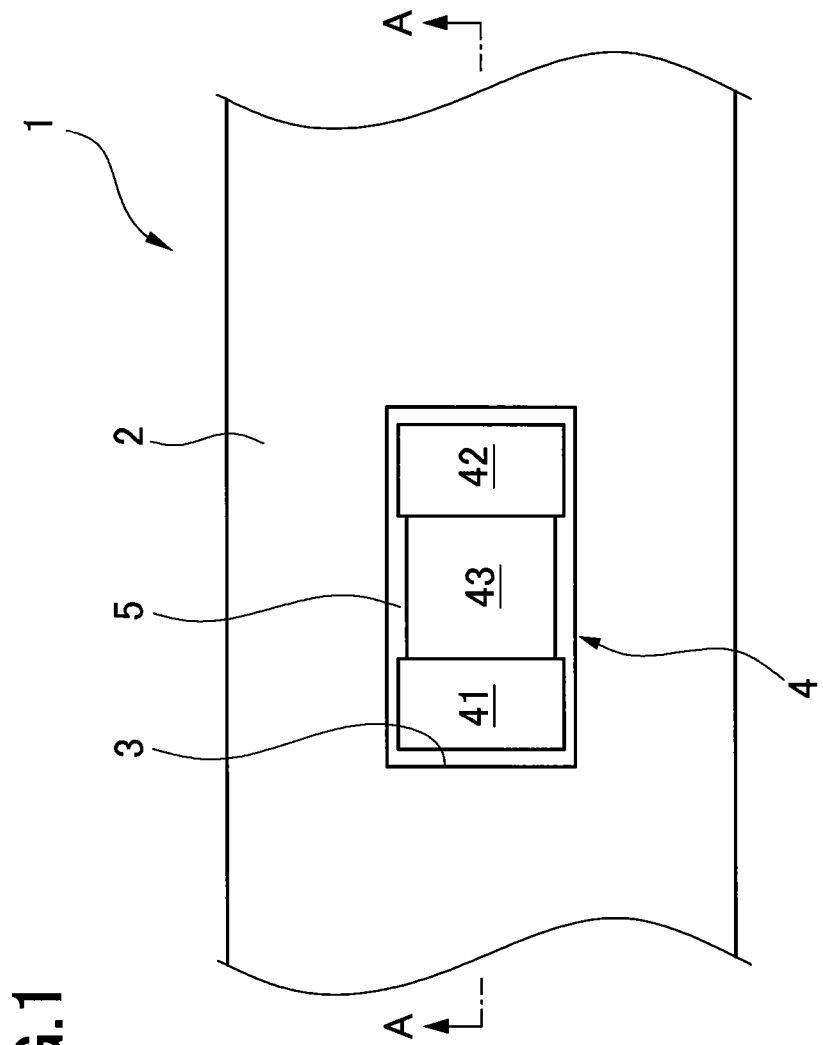
FIG. 1 is a perspective plan view illustrating a wiring board with a built-in electronic component according to an embodiment of the present invention.

The embodiments will now be described with reference to the accompanying drawings, wherein like reference numerals designate corresponding or identical elements throughout the various drawings.

Figure 2:
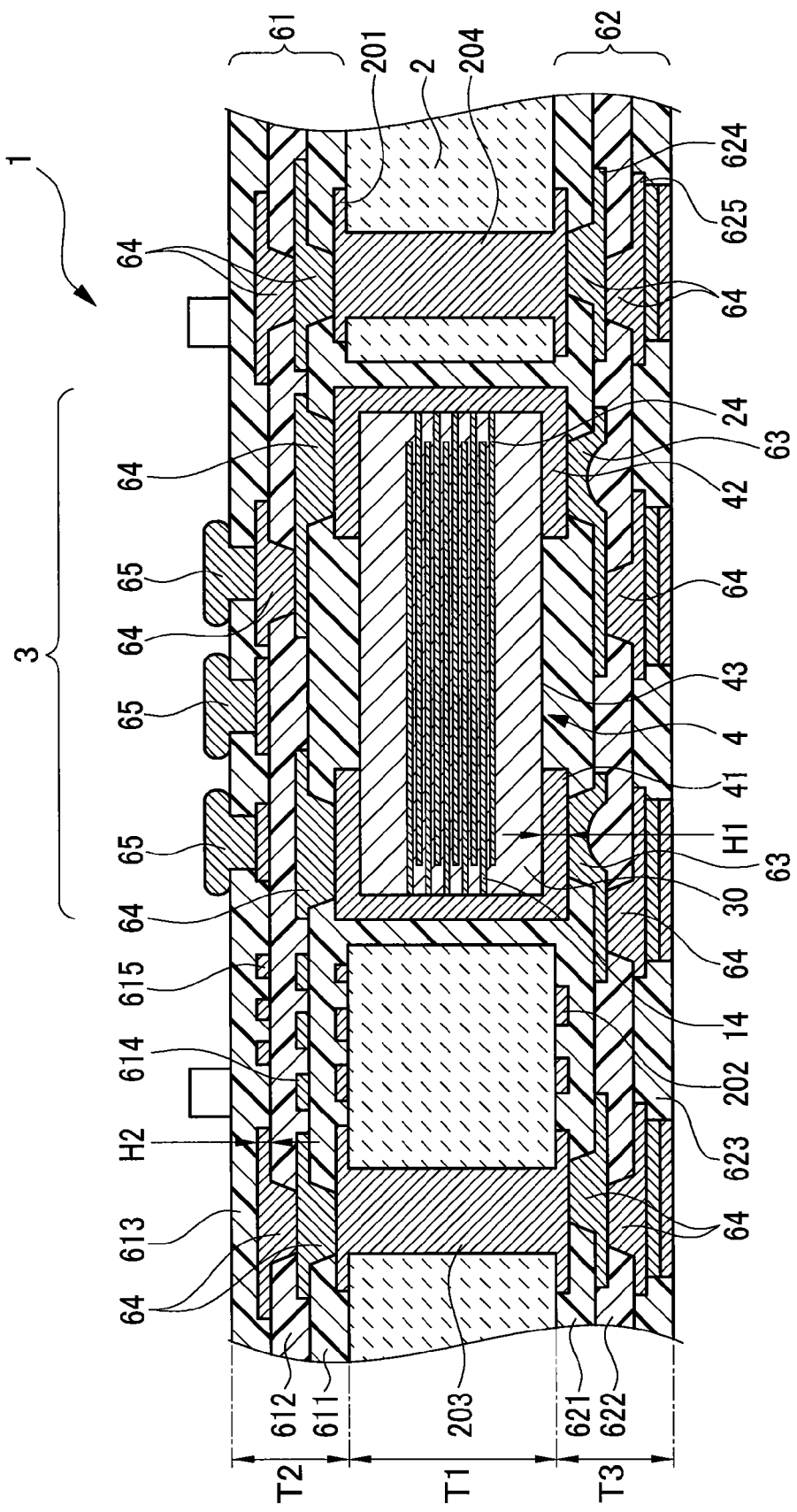
FIG. 2 is a cross-sectional view of the wiring board with a built-in electronic component according to the embodiment of the present invention.

A wiring board with a built-in electronic component according to an embodiment is of a thin type to be used mainly in a mobile device, and is structured as shown in a plan view of FIG. 1 and a cross-sectional view of FIG. 2. In wiring board 1 with a built-in electronic component, rectangular cavity 3 is formed in a portion of core wiring board 2, and electronic component 4 is arranged in cavity 3 as shown in FIG. 1.

Core wiring board 2 is a wiring board formed by laminating conductive layers and insulation layers. Cavity 3 is a through hole formed by boring a portion of core wiring board 2. Cavity 3 in wiring board 1 with a built-in electronic component shown in FIG. 1 accommodates electronic component 4. A portion of cavity 3 not occupied by electronic component 4 is not hollow, and is filled with filling resin 5.

Electronic component 4 in the present embodiment is a multilayer ceramic capacitor, which will be referred to hereinafter as "MLCC 4." MLCC 4 has a flat rectangular shape as a whole. On each end in a longitudinal direction, MLCC 4 has a region whose surface is covered with electrode (41 or 42). Electrodes (41, 42) are current-carrying electrodes connected to internal conductors of MLCC 4. Electrodes (41, 42) are arranged respectively along the short sides of MLCC 4. Region 43 not covered by an electrode is present between electrodes (41, 42).

FIG. 2 is a cross section taken along line (A-A) in FIG. 1. As seen in FIG. 2, wiring board 1 with a built-in electronic component has upper and lower surfaces covered with upper laminated portions (61, 62), respectively. Upper laminated portions (61, 62) respectively cover main surfaces of core wiring board 2 and MLCC 4 (upper and lower surfaces of core wiring board 2 and MLCC 4 in FIG. 2). Upper laminated portions (61, 62) will be described in detail later.

As seen in FIG. 2, wiring patterns (201, 202) are formed on upper and lower surfaces of core wiring board 2, respectively. Wiring patterns (201, 202) become inner-layer patterns when upper layers are further laminated. It is an option for core wiring board 2 to have an inner wiring pattern in addition to wiring patterns (201, 202) formed on its surfaces. However, neither wiring patterns (201, 202) nor such an inner wiring pattern is formed in the range of region 30 of cavity 3. In a portion other than cavity 3, core wiring board 2 is provided with filled through holes (203, 204). Filled through holes (203, 204) are for achieving conduction between wiring patterns (201, 202).

Core wiring board 2 has a thickness (T1) set at approximately 60-200 µm. Core wiring board 2 is made of insulative resin containing glass cloth. Therefore, the thermal expansion coefficient of core wiring board 2 is low, at no higher than 10 ppm/K. Wiring patterns (201, 202) each have an approximate thickness of 7-15 µm and an approximate thermal expansion coefficient of 16 ppm/K.

As shown in FIG. 2, MLCC 4 internally has first and second conductive layers (14, 24) which are alternately laminated with interlayer insulation material 30 interposed therebetween. First conductive layer 14 is connected to electrode 41. Second conductive layer 24 is connected to electrode 42. A pair of first conductive layer 14 and electrode 41 is electrically isolated from a pair of second conductive layer 24 and electrode 42. Thereby, MLCC 4 functions as a stacked capacitor. In practice, more layers are present as first and second conductive layers (14, 24). MLCC 4 has a thickness substantially equal to or slightly smaller than thickness (T1) of core wiring board 2.

Next, upper laminated portions (61, 62) are described. Upper laminated portions (61, 62) are each formed by alternately laminating an insulation layer and a wiring pattern layer. In the example of FIG. 2, upper laminated portion 61 is formed with two interlayer insulation layers (611, 612), an outermost protective insulation layer 613, and upper wiring layers (614, 615) interposed therebetween. Likewise, upper laminated portion 62 is formed with two interlayer insulation layers (621, 622), an outermost protective insulation layer 623, and upper wiring layers (624, 625) interposed therebetween. Interlayer insulation layers (611, 612, 621, 622) are made of insulation resin not containing glass cloth, and have a thermal expansion coefficient of about 40 ppm/K.

In wiring board 1 with a built-in electronic component, electrodes (41, 42) of MLCC 4 each have a thickness (H1) of approximately 15~20 µm, which is greater than thickness (H2) of each of upper wiring layers (614, 615, 624, 625). Wiring patterns (201, 202) each have a thickness set at approximately the same as thickness (H2) of upper wiring layers (614, 615, 624, 625).

Interlayer insulation layer 611 is provided with filled vias 64 electrically connecting electrodes (41, 42) of MLCC 4 to upper wiring layer 614. Interlayer insulation layer 621 is provided with recessed vias 63 electrically connecting electrodes (41, 42) respectively to upper wiring layer 624. At appropriate positions of interlayer insulation layers (611, 612, 621, 622), filled vias 64 are formed for conduction between wiring patterns (201, 202) and upper wiring layers (614, 615, 624, 625). Also, at appropriate positions of protective insulation layer 613, bumps 65 are formed for making an external electrical access with wiring board 1 with the built-in electronic component. Thicknesses (T2, T3) of upper laminated portions (61, 62) are smaller than thickness (T1) of core wiring board 2, and are set at approximately 50~150 µm. Wiring board 1 with a built-in electronic component in FIG. 2 can also have another electronic component mounted on the board surface, in which case the other electronic component is mounted on the upper surface in FIG. 2.

Wiring board 1 with a built-in electronic component described above has the following advantages attributable to its structural features.

In a first feature, electrodes (41, 42) of MLCC 4 each have a thickness (H1) greater than thickness (H2) of each of upper wiring layers (614, 615, 624, 625). In other words, the thickness (H2) of each of upper wiring layers (614, 615, 624, 625) is smaller than the thickness (H1) of electrode (41 or 42) of MLCC 4. Greater thicknesses of electrodes (41, 42) of MLCC 4 prevent cracking of MLCC 4 when MLCC 4 is mounted. Greater thicknesses of electrodes (41, 42) increase the thicknesses of interlayer insulation layers (611, 612) located immediately above them. Therefore, MLCC 4 is protected. Also, greater thicknesses of electrodes (41, 42) prevent peeling and penetration caused by thermal damage when recessed vias 63 are formed by laser irradiation.

On the other hand, smaller thicknesses of upper wiring layers (614, 615, 624, 625) suppress warping of wiring board 1 with a built-in electronic component as a whole. Wiring board 1 with a built-in electronic component may warp due to a difference in coefficients of thermal expansion between core wiring board 2 and upper laminated portions (61, 62). Wiring board 1 with a built-in electronic component is made substantially thin, and such thinness means that resistance to the cause of warping is low, that is warping is likely to occur. In the present embodiment, as described above, upper wiring layers (614, 615, 624, 625) as well as interlayer insulation layers (611, 612, 621, 622) have higher coefficients of thermal expansion than core wiring board 2. Namely, upper laminated portions (61, 62) show greater thermal expansion than core wiring board 2. However, upper wiring layers (614, 615, 624, 625) are thin, and therefore upper laminated portions (61, 62) have low rigidity. Accordingly, warping is suppressed from occurring in wiring board 1 with a built-in electronic component.

In a second feature, thicknesses (T2, T3) of upper laminated portions (61, 62) are each set to be smaller than thickness (T1) of core wiring board 2. Such setting means smaller force is derived from upper laminated portions (61, 62) to cause warping in wiring board 1 with a built-in electronic component. Therefore, such a relationship in thickness contributes to suppress the warping of wiring board 1 with a built-in electronic component. Even when only either one of the first or second feature is employed, it takes effect to a certain extent.

In a third feature, recessed vias 63 are used for the vias immediately above electrodes (41, 42) of MLCC 4 on the lower-surface side in FIG. 2, and filled vias 64 are used for the other vias (the vias immediately above electrodes (41, 42) on the upper-surface side as well as the other interlayer vias). A larger area can be formed more easily on a recessed via than on a filled via. Also, since a filled via has a flat upper surface, it is easier to form a stacked structure by stacking a via immediately over another via. Therefore, on the lower-surface side on which another electronic component is not mounted on the board, wiring board 1 with a built-in electronic component employs recessed vias 63 for electrodes (41, 42) having larger areas, thereby reducing the resistance of the access path to MLCC 4. On the upper-surface side for mounting an electronic component on the board surface, filled vias 64 are used with a focus given to flatness. In other portions, filled vias 64 are stacked to effectively use the substrate area. However, even in positions immediately above electrodes (41, 42) on the lower-surface side, filled vias may also be used if priority is given to a stacked structure.

Figure 3:
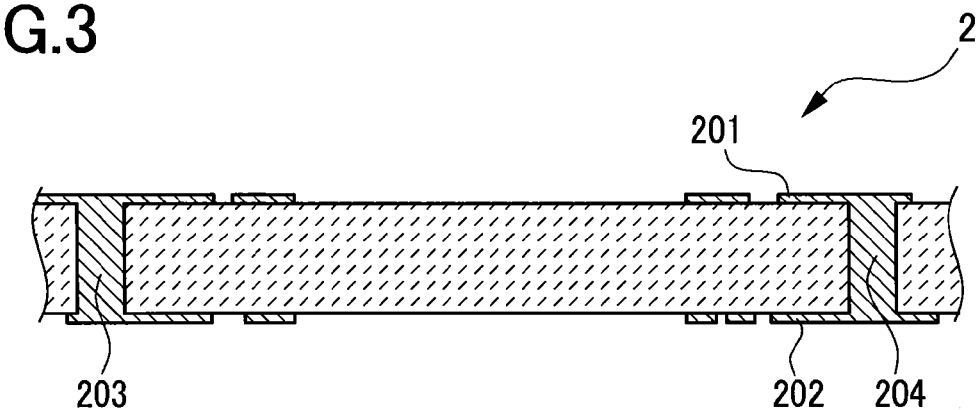
FIG. 3 is a cross-sectional view of a core wiring board used as a starting material according to an embodiment of the present invention.
Figure 4:
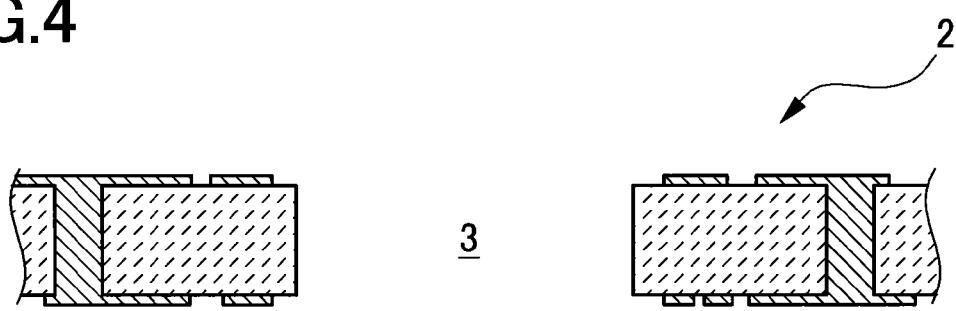
FIG. 4 is a cross-sectional view of the core wiring board where a cavity is formed according to an embodiment of the present invention.
Figure 5:
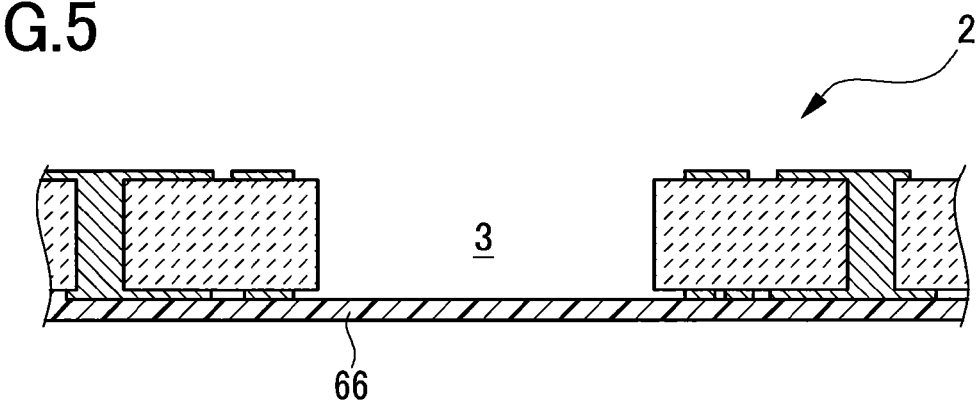
FIG. 5 is a cross-sectional view of the core wiring board where an adhesive tape is laminated according to an embodiment of the present invention.
Figure 6:
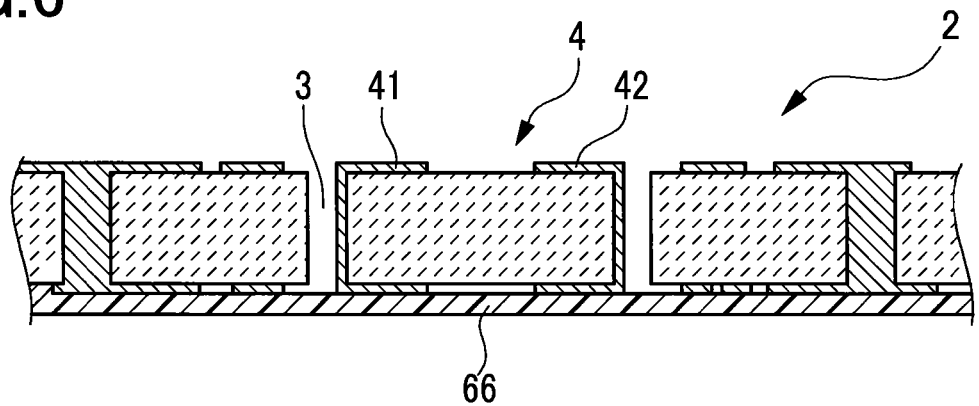
FIG. 6 is a cross-sectional view of the core wiring board on which an MLCC is mounted according to an embodiment of the present invention.

A method for manufacturing the aforementioned wiring board with a built-in electronic component according to an embodiment of the present invention is now described below with reference to cross-sectional views of FIGS. 3~11. FIG. 3 illustrates core wiring board 2 used as a starting material in this embodiment. Wiring patterns (201, 202) as well as filled through holes (203, 204) are already formed, but cavity 3 is not yet formed. FIG. 4 illustrates a state in which cavity 3 is formed. Surface-roughening processing is performed on wiring patterns (201, 202). Then, adhesive tape 66 is laminated to core wiring board 2 already subjected to the surface-roughening processing so that a state in FIG. 5 is attained. MLCC 4 is mounted on tape-laminated core wiring board 2 to attain a state in FIG. 6. That is, MLCC 4 is accommodated in cavity 3 in the core wiring board 2.

Figure 7:
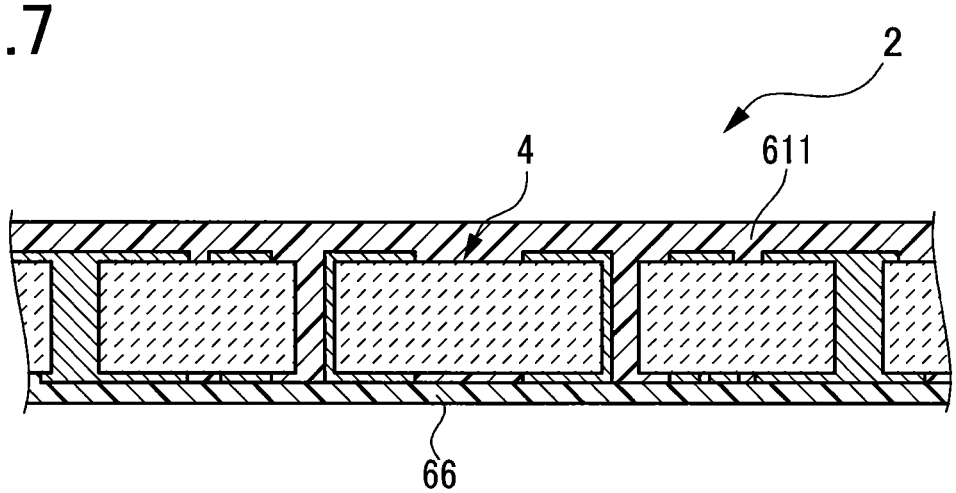
FIG. 7 is a cross-sectional view of the core wiring board after first lamination according to an embodiment of the present invention.
Figure 8:
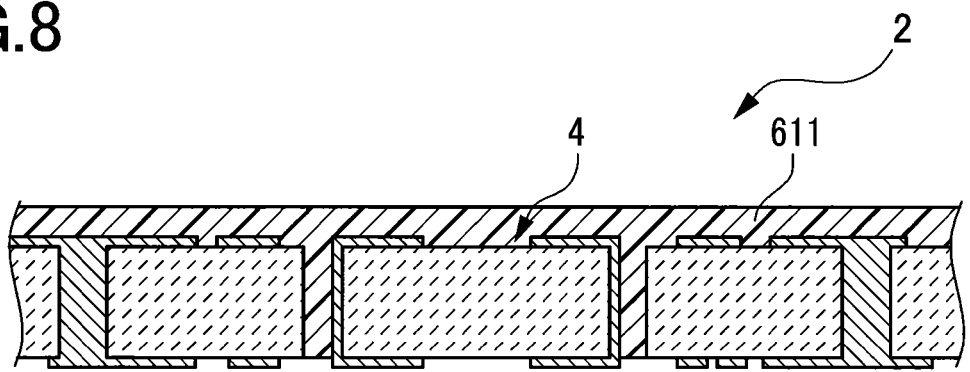
FIG. 8 is a cross-sectional view of the core wiring board from which the adhesive tape is removed according to an embodiment of the present invention.
Figure 9:
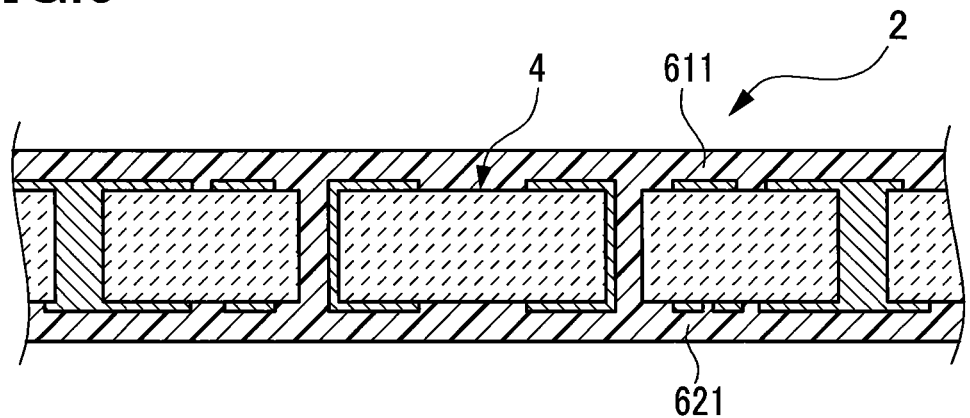
FIG. 9 is a cross-sectional view of the core wiring board after second lamination according to an embodiment of the present invention.
Figure 10:
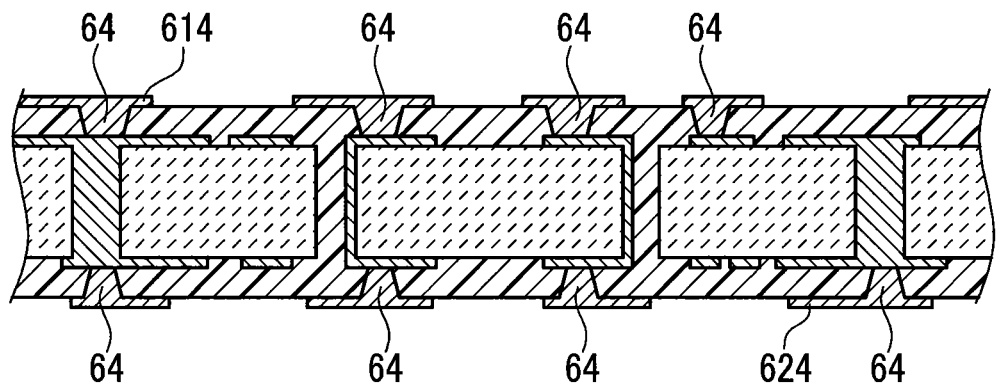
FIG. 10 is a cross-sectional view of the core wiring board where outer-layer patterns are formed according to an embodiment of the present invention.
Figure 11:
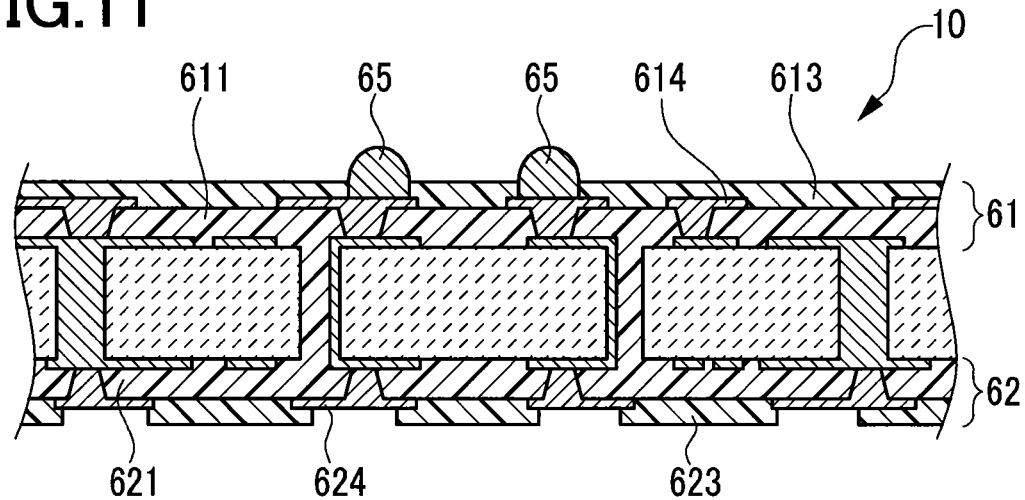
FIG. 11 is a cross-sectional view of a wiring board with a built-in electronic component provided with a protective insulation layer according to an embodiment of the present invention.

Next, an interlayer insulation layer is laminated for the first surface to attain a state in FIG. 7. In the state of FIG. 7, interlayer insulation layer 611 is formed. Also, the space in cavity 3 is filled. After removing adhesive tape 66 (FIG. 8), the interlayer insulation layer is laminated for the second surface to attain a state in FIG. 9. In the state in FIG. 9, interlayer insulation layer 621 is formed in addition to interlayer insulation layer 611. Then, interlayer insulation layers (611, 612) are cured, and the upper wiring layers are formed to attain a state in FIG. 10. In the state of FIG. 10, upper wiring layers (614, 624), recessed vias 63 and filled vias 64 are formed. When protective insulation layers (613, 623) as well as bumps 65 are formed, a wiring board 10 with a built-in electronic component in FIG. 11 is obtained. In wiring board 10 with a built-in electronic component, upper laminated portion 61 is made up of interlayer insulation layer 611, upper wiring layer 614 and protective insulation layer 613. Likewise, upper laminated portion 62 is made up of interlayer insulation layer 621, upper wiring layer 624, and protective insulation layer 623.

Wiring board 10 with a built-in electronic component in FIG. 11 differs from wiring board 1 with a built-in electronic component in FIG. 2 on the following two points. First, each of upper laminated portions (61, 62) includes one interlayer insulation layer and one upper wiring layer. In this case, the total thicknesses of upper laminated portions (61, 62) are smaller than the thickness of core wiring board 2. Second, the access paths to electrodes (41, 42) of MLCC 4 are not formed of the recessed vias, but are formed using filled vias 64. In wiring board 10 with a built-in electronic component in FIG. 11, therefore, bump 65 can be stacked immediately on filled via 64 to MLCC 4.

Figure 12:
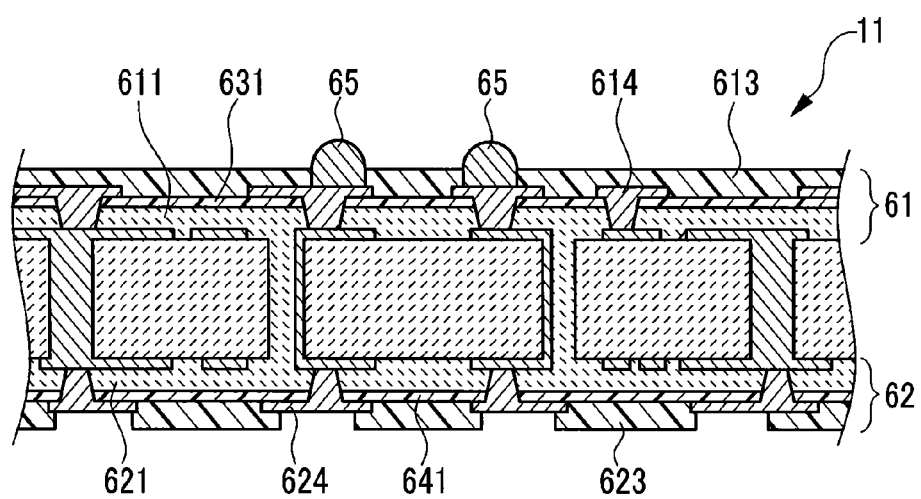
FIG. 12 is a cross-sectional view of a wiring board with a built-in electronic component provided with the protective insulation layer and others according to another embodiment of the present invention.

Wiring board 10 with a built-in electronic component in FIG. 11 may be modified as illustrated in FIG. 12. Wiring board 11 with a built-in electronic component in FIG. 12 employs two layers each of interlayer insulation layers (611, 612) in wiring board 10 with a built-in electronic component in FIG. 11. More specifically, in wiring board 11 with a built-in electronic component in FIG. 12, interlayer insulation layers on the upper- and lower-surface sides each have a two-layer structure formed with lower insulation layer (611 or 621) and upper insulation layer (631 or 641). Lower insulation layers (611, 621) as well as upper insulation layers (631, 641) are insulation layers containing glass cloth. The rest of the structure is the same as in wiring board 10 with a built-in electronic component in FIG. 11. Wiring board 11 with a built-in electronic component in FIG. 12 is more advantageous in terms of rigidity than wiring board 10 with a built-in electronic component in FIG. 11, and warping is further less likely to occur.

As described above, in wiring boards (1, 10, 11) each with a built-in electronic component according to the embodiments, electrodes (41, 42) of MLCC 4 have thickness (H1) greater than thickness (H2) of upper wiring layers (614, 615, 624, 625). Also, upper laminated portions (61, 62) have thicknesses (T2, T3) smaller than thickness (T1) of core wiring board 2. Being set in such a way effectively suppresses the warping of wiring boards (1, 10, 11) with the built-in electronic components due to the difference in coefficients of thermal expansion between core wiring board 2 and upper laminated portions 61 and 62, even when the boards are of a thin type required for use in mobile devices. Further, damage to MLCC 4 is prevented, and cracking thereof is prevented. Namely, the wiring board with the built-in electronic component effectively compensating for insufficient mechanical strength due to a thin-type board is achieved.

The embodiments above are merely examples, and the present invention is not limited to any of those embodiments. Accordingly, various improvements and modifications may be employed within a scope that does not deviate from the gist of the present invention. For example, in wiring boards (1, 10, 11) with a built-in electronic component, the wiring patterns of the respective wiring layers, positions of the vias and through holes, and others are not limited specifically. Any other component or substrate may be mounted on the board. Cavity 3 in core wiring board 2 is not limited to a penetrating hole, and may also be a cavity that opens only on one side and has a bottom.

Wiring boards adapted to smaller devices such as mobile devices may be desirable to have reduction of their entire thickness to about 200-350 μm, and a core substrate, electronic component, interlayer insulation layer and conductive layer may each be desirable to be thinner. A wiring board with a built-in electronic component having a thickness reduced to such a level cannot ensure mechanical strength. In some cases, a wiring board warps when an electronic component is mounted. The warping causes problems when another component or substrate is mounted on the wiring board, or when the wiring board is mounted on a device. The electronic component itself cracks due to internal stress caused by the warping, or in some cases due to externally exerted stress.

A wiring board with a built-in electronic component according to an embodiment of the present invention is not affected by insufficient mechanical strength even its thickness is reduced to a level desired for use in mobile devices.

A wiring board with a built-in electronic component according to an embodiment of the present invention includes a core substrate with a thickness not exceeding 300 μm, which is provided with a cavity that opens on at least one surface; an electronic component with a thickness not exceeding 300 μm, which is accommodated in the cavity and which has a current-carrying electrode at its surface; and a resin insulation layer laminated on the same side as the opening of the cavity to cover surfaces of the core substrate and the electronic component. In such a wiring board, an upper wiring layer with a thickness smaller than the current-carrying electrode is formed either between the core substrate and the resin insulation layer or on the resin insulation layer.

In the above wiring board with a built-in electronic component, the current-currying electrode of the electronic component is thicker than the upper wiring layer formed between the core substrate and the resin insulation layer or on the resin insulation layer. The resin insulation layer immediately above the current-carrying electrode has a greater thickness and protects the electronic component from cracking. Further, the upper wiring layer on the resin insulation layer is thin, and the upper laminated portion, which is made up of the resin insulation layer and the upper wiring layer, has relatively low rigidity, but warping is prevented from occurring in the wiring board with the built-in electronic component.

A wiring board with a built-in electronic component according to another embodiment of the present invention may be structured to have a core substrate with a thickness not exceeding 300 μm, which is provided with a cavity that opens on at least one surface; an electronic component with a thickness not exceeding 300 μm, which is accommodated in the cavity; and an upper laminated portion formed by laminating an insulation layer and conductive layer to cover surfaces of the core substrate and the electronic component on the same side as the opening of the cavity. In such a wiring board, the upper laminated portion is set to have a thickness smaller than that of the core substrate. The force which causes warping is weak in the upper laminated portion, and warping is also prevented in the wiring board with a built-in electronic component having the above-described structure.

Preferably, the core substrate may be made of an insulating resin containing glass cloth and the resin insulation layer may be made of insulating resin that does not contain glass cloth. Such a structure is effective in view of a difference in coefficients of thermal expansion between the core substrate and the resin insulation layer. The resin insulation layer may be formed with two layers made of insulating resin containing glass cloth and another insulating resin not containing glass cloth formed on the upper layer side. Further, in the case where one of the surfaces of a wiring board with a built-in electronic component is formed to mount a second electronic component on the board, and the opposite surface is formed not to mount a second electronic component, a via connected to a current-carrying electrode on the side not mounting any component is preferred to be a recessed via, while a via connected to a current-carrying electrode of the electronic component on the side mounting another component, along with other vias for interconnection, is preferred to be a filled via. Such a structure achieves lower resistance of an access path to the electronic component as well as effective use of a substrate area by stacking vias in other portions.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
   a core substrate having a thickness not exceeding 300 μm and having a cavity having an opening on a surface of the core substrate and a second opening on a second surface on an opposite side of the core substrate with respect to the surface;
   an electronic component having a thickness not exceeding 300 μm and accommodated in the cavity of the core substrate;
   a laminated structure formed on the surface of the core substrate and comprising an insulation resin layer and a wiring layer such that the laminated structure is covering the opening of the cavity of the core substrate and the electronic component accommodated in the cavity of the core substrate; and
   a second laminated structure formed on the second surface of the core substrate and comprising an insulation resin layer such that the second laminated structure is covering the second opening of the cavity of the core substrate and the electronic component accommodated in the cavity of the core substrate,
   wherein the electronic component has an insulation material body and an electrode formed on a surface of the insulation material body, the wiring layer of the laminated structure is formed such that a thickness of the wiring layer is set smaller than a thickness of the electrode, the laminated structure has a filled via structure connected to the electrode of the electronic component, and the second laminated structure has a recessed via structure connected to a second electrode of the electronic component on a second surface of the insulation material body on an opposite side with respect to the surface having the electrode.

2. The wiring board with a built-in electronic component according to claim 1, wherein the laminated structure is formed such that a thickness of the laminated structure is set smaller than a thickness of the core substrate.

3. The wiring board with a built-in electronic component according to claim 1, wherein the core substrate comprises a glass cloth and a resin material, and the insulation resin layer of the laminated structure does not include a glass cloth.

4. The wiring board with a built-in electronic component according to claim 1, wherein the core substrate comprises a glass cloth and a resin material, and the insulation resin layer of the laminated structure comprises a lower resin layer comprising a glass cloth and a resin material and an upper resin layer formed on the lower resin layer and comprising a resin material without a glass cloth.

5. The wiring board with a built-in electronic component according to claim 1, wherein the laminated structure has a plurality of bump structures positioned to mount a second electronic component on a surface of the laminated structure.

6. The wiring board with a built-in electronic component according to claim 1, wherein the second laminated structure comprises a wiring layer, the laminated structure is formed such that a thickness of the laminated structure is set smaller than a thickness of the core substrate, and the second laminated structure is formed such that a thickness of the second laminated structure is set smaller than the thickness of the core substrate.

7. The wiring board with a built-in electronic component according to claim 1, wherein the second laminated structure comprises a wiring layer, and the wiring layer of the second laminated structure is formed such that a thickness of the wiring layer of the second laminated structure is set smaller than the thickness of the electrode.

8. The wiring board with a built-in electronic component according to claim 1, wherein the second laminated structure comprises a plurality of insulation resin layers and a plurality of wiring layers, the laminated structure has a plurality of insulation resin layers including the insulation resin layer and a plurality of wiring layers including the wiring layer, each of the wiring layers of the laminated structure is formed such that a thickness of each of the wiring layers of the laminated structure is set smaller than the thickness of the electrode, and each of the wiring layers of the second laminated structure is formed such that a thickness of each of the wiring layers of the second laminated structure is set smaller than the thickness of the electrode.

9. The wiring board with a built-in electronic component according to claim 1, wherein the cavity of the core substrate is formed such that the cavity is penetrating through the core substrate and has a second opening on a second surface of the core substrate on an opposite side with respect to the surface having the laminated structure.

10. The wiring board with a built-in electronic component according to claim 1, wherein the cavity of the core substrate is formed such that the cavity is penetrating through the core substrate.

11. The wiring board with a built-in electronic component according to claim 1, wherein the cavity of the core substrate is formed such that the cavity is penetrating through the core substrate, and the electronic component is a capacitor device having the second electrode on the second surface of the insulation material body on the opposite side with respect to the surface having the electrode.

12. The wiring board with a built-in electronic component according to claim 1, the electronic component is a capacitor device having the second electrode on the second surface of the insulation material body on the opposite side with respect to the surface having the electrode.

13. The wiring board with a built-in electronic component according to claim 1, wherein the wiring layer of the laminated structure is formed on the core substrate, and the insulation resin layer of the laminated structure is formed on the wiring layer.

14. The wiring board with a built-in electronic component according to claim 1, wherein the wiring layer of the laminated structure is formed on the insulation resin layer of the laminated structure.

15. A wiring board with a built-in electronic component, comprising:
a core substrate having a thickness not exceeding 300 μm and having a cavity having an opening on a surface of the core substrate and a second opening on a second surface on an opposite side of the core substrate with respect to the surface;
an electronic component having a thickness not exceeding 300 μm and accommodated in the cavity of the core substrate;
a laminated structure formed on the surface of the core substrate and comprising an insulation resin layer and a wiring layer such that the laminated structure is covering the opening of the cavity of the core substrate and the electronic component accommodated in the cavity of the core substrate; and
a second laminated structure formed on the second surface of the core substrate and comprising an insulation resin layer such that the second laminated structure is covering the second opening of the cavity of the core substrate and the electronic component accommodated in the cavity of the core substrate,
wherein the laminated structure is formed such that a thickness of the laminated structure is set smaller than a thickness of the core substrate, the laminated structure has a filled via structure connected to the electrode of the electronic component, and the second laminated structure has a recessed via structure connected to a second electrode of the electronic component on a second surface of the insulation material body on an opposite side with respect to the surface having the electrode.

16. The wiring board with a built-in electronic component according to claim 15, wherein the core substrate comprises a glass cloth and a resin material, and the insulation resin layer of the laminated structure does not include a glass cloth.

17. The wiring board with a built-in electronic component according to claim 15, wherein the core substrate comprises a glass cloth and a resin material, and the insulation resin layer of the laminated structure comprises a lower resin layer comprising a glass cloth and a resin material and an upper resin layer formed on the lower resin layer and comprising a resin material without a glass cloth.

18. The wiring board with a built-in electronic component according to claim 15, wherein the laminated structure has a plurality of bump structures positioned to mount a second electronic component on a surface of the laminated structure.

19. The wiring board with a built-in electronic component according to claim 15, wherein the second laminated structure comprises a wiring layer and is formed such that a thickness of the second laminated structure is set smaller than the thickness of the core substrate.

20. The wiring board with a built-in electronic component according to claim 15, wherein the second laminated structure comprises a plurality of insulation resin layers and a plurality of wiring layers, the laminated structure has a plurality of insulation resin layers including the insulation resin layer and a plurality of wiring layers including the wiring layer, and the second laminated structure is formed such that a thickness of the second laminated structure is set smaller than the thickness of the core substrate.

* * * * *